United States Patent [19]
Kobayashi

[11] Patent Number: 5,475,303
[45] Date of Patent: Dec. 12, 1995

[54] ELECTRONIC WATTHOUR METER

[75] Inventor: Shunichi Kobayashi, Kanagawaken, Japan

[73] Assignee: Kabushiki Kaisha Toshiba, Kawasaki, Japan

[21] Appl. No.: 369,398

[22] Filed: Jan. 6, 1995

Related U.S. Application Data

[62] Division of Ser. No. 979,214, Nov. 20, 1992, Pat. No. 5,414,349.

[30] Foreign Application Priority Data

Nov. 21, 1991 [JP] Japan ..................................... 3-305787

[51] Int. Cl.$^6$ ..................................................... G01R 1/04
[52] U.S. Cl. ................. 324/142; 324/117 H; 324/117 R; 324/141
[58] Field of Search ............................... 324/142, 117 H, 324/11 RR, 141

[56] References Cited

U.S. PATENT DOCUMENTS

| | | | |
|---|---|---|---|
| 4,292,582 | 9/1981 | Hino ..................... | 324/117 H |
| 4,464,629 | 8/1984 | Tanaka et al. .................. | 324/142 |
| 4,761,605 | 8/1988 | Jochum ................... | 324/142 |
| 4,775,834 | 10/1988 | Lahti ....................... | 324/142 |
| 4,843,311 | 6/1989 | Rozman et al. ............... | 324/142 |
| 4,853,620 | 8/1989 | Halder et al. ............... | 324/142 |

FOREIGN PATENT DOCUMENTS

| | | |
|---|---|---|
| 0302172 | 2/1989 | European Pat. Off. . |
| 0322802 | 7/1989 | European Pat. Off. . |
| 0333197 | 9/1989 | European Pat. Off. . |
| 3723268 | 1/1988 | Germany . |
| 9012839 | 9/1991 | Germany . |
| 58-137774 | 8/1983 | Japan . |
| 59-53508 | 12/1984 | Japan . |
| 60-54704 | 12/1985 | Japan . |
| 62-502927 | 11/1987 | Japan . |

*Primary Examiner*—Kenneth A. Wieder
*Assistant Examiner*—Barry C. Bowser
*Attorney, Agent, or Firm*—Foley & Lardner

[57] ABSTRACT

A first Hall element is supplied with a current proportional to a load voltage and applied with a magnetic field proportional to a load current and produces a voltage proportional to a load power given by the load voltage and the load current. A second Hall element has the same characteristic as that of the first Hall element and supplied with the current proportional to the load voltage and no magnetic field. The output voltages of the first and the second Hall elements are combined by combining means to compensate and remove an offset voltage component contained in the output voltage of the first Hall element.

3 Claims, 3 Drawing Sheets

ELECTRONIC WATTHOUR METER

This application is a divisional of application Ser. No. 07/979,214 filed Nov. 20, 1992 now U.S. Pat. No. 5,414,349, issued on May 9, 1995.

BACKGROUND OF THE INVENTION

This invention relates to an electronic watthour meter including a conversion element, such as a magneto-electric conversion element, for conversion into electric energy by the use of a physical effect.

A conventional electronic watthour meter is disclosed, for example, in Japanese Patent Publications Nos. 58508/1984 and 54704/1985. The conventional electronic watthour meter comprises an auxiliary voltage transformer for producing a voltage output signal proportional to a load voltage of a distribution line, an auxiliary current transformer for producing a current output signal proportional to a consumed current, a power-voltage conversion circuit for multiplying the voltage output signal and the current output signal from the auxiliary voltage transformer and the auxiliary current transformer to produce an output voltage proportional to a load power, a voltage-frequency conversion circuit supplied from the power-voltage conversion circuit with the output voltage proportional to the load power for integrating the output voltage to produce a pulse signal, a frequency dividing circuit for weighting the pulse signal from the voltage-frequency conversion circuit to produce a divided pulse signal proportional to electric power, and a display circuit responsive to the divided pulse signal from the frequency dividing circuit for displaying the amount of electric power consumption represented by the divided pulse signal.

FIG. 1 shows a structure of the power-voltage conversion circuit including a Hall element (Hall-effect element) as a magneto-electric conversion element. Referring to FIG. 1, an auxiliary voltage transformer 1 produces a voltage output signal proportional to a load voltage. The voltage output signal from the auxiliary voltage transformer 1 is converted through a resistor 2 into a current i which is supplied to a Hall element 3. A consumed current supplied to an auxiliary current transformer flows through a primary conductor 5 wound around a core 4 to produce a magnetic field proportional to the consumed current. The magnetic field is applied to the Hall element 3.

Supplied with the current i and the magnetic field having a field intensity B, the Hall element 3 produces, by a Hall effect, a voltage Vop proportional to electric power corresponding to a product of the current i and the field intensity B, as represented by the following formula:

$$Vop \propto kiB,$$

where k represents a proportional constant.

The voltage Vop produced by the Hall element 3 has a low level. As shown in FIG. 1, the voltage Vop is amplified by an amplifier circuit 6 and integrated by an integrator circuit 7 of the voltage-frequency conversion circuit to be produced as a voltage signal having an appropriate level proportional to the electric power.

Generally, the Hall element 3 produces an offset voltage even when no input is supplied, namely, when no magnetic field is applied. This results in deterioration of a linear characteristic of the Hall element 3. In particular, considerable deterioration is observed in case of a small load.

SUMMARY OF THE INVENTION

In view of the above, it is an object of this invention to provide an electronic watthour meter which is capable of removing an offset voltage produced by a magneto-electric conversion element such as a Hall element and which can therefore improve a characteristic of the magneto-electric conversion element as well as a stability.

In order to accomplish the above-mentioned object, an electronic watthour meter according to a first aspect of this invention comprises: a first Hall-effect element supplied with a current proportional to a load voltage and applied with a magnetic field proportional to a load current for producing a voltage proportional to a load power given by the load voltage and the load current; a second Hall-effect element having the same characteristic as that of the first Hall-effect conversion element and supplied with the current proportional to the load voltage and no magnetic field; and a combining unit for combining the outputs of the first and the second Hall-effect elements to compensate an offset voltage component contained in the output of the first Hall-effect element.

In the electronic watthour meter according to this invention, the outputs of the first and the second Hall-effect elements are combined to thereby compensate the offset voltage component contained in the output of the first Hall-effect element.

According to a second aspect of this invention, an electronic watthour meter comprises: a Hall-effect conversion element supplied with a current proportional to a load voltage and applied with a magnetic field proportional to a load current for producing a voltage proportional to a load power given by the load voltage and the load current; a switching unit for periodically reversing in a predetermined cycle a direction of the current proportional to the load voltage and supplied to the Hall-effect element and a direction of the magnetic field proportional to the load current and supplied to the Hall-effect element; and an integrating unit for integrating the output voltage of the Hall-effect element.

In the above-mentioned electronic watthour meter according to this invention, the direction of the current proportional to the load voltage and supplied to the Hall-effect element and the direction of the magnetic field proportional to the load current and applied to the Hall-effect element are periodically reversed by the switching unit in a predetermined cycle. The output voltage of the Hall-effect element is integrated by the integrating unit to remove an offset voltage component contained in the output voltage of the Hall-effect element.

DESCRIPTION OF THE PREFERRED EMBODIMENTS

First Embodiments

Figure 1:
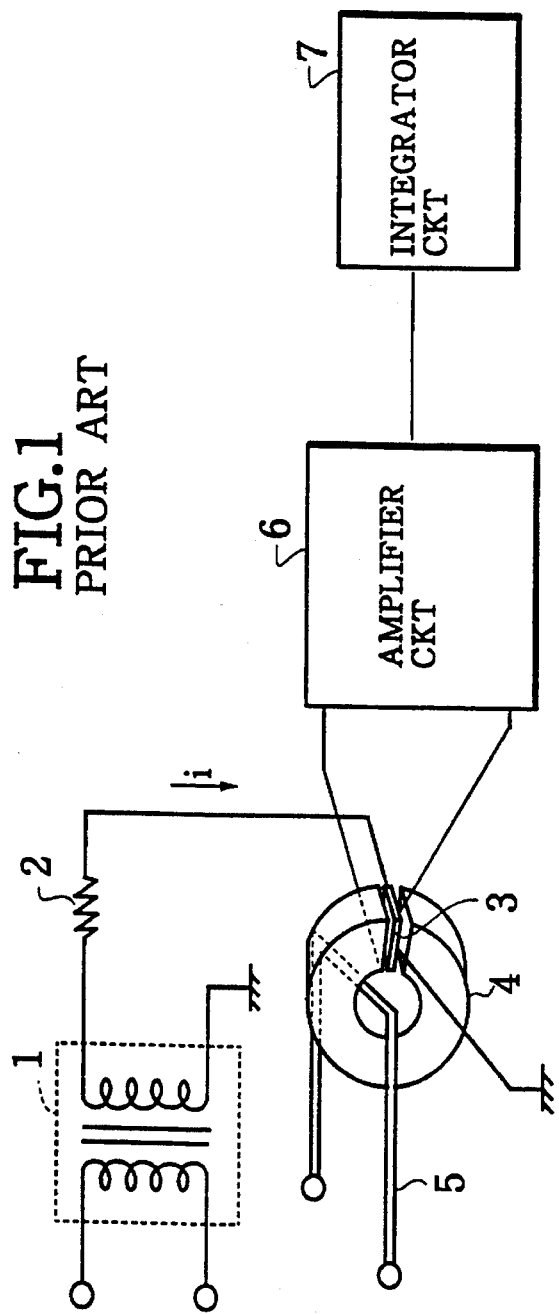
FIG. 1 shows a structure of a power-voltage conversion circuit using a Hall element for use in a conventional electronic watthour meter.
Figure 2:
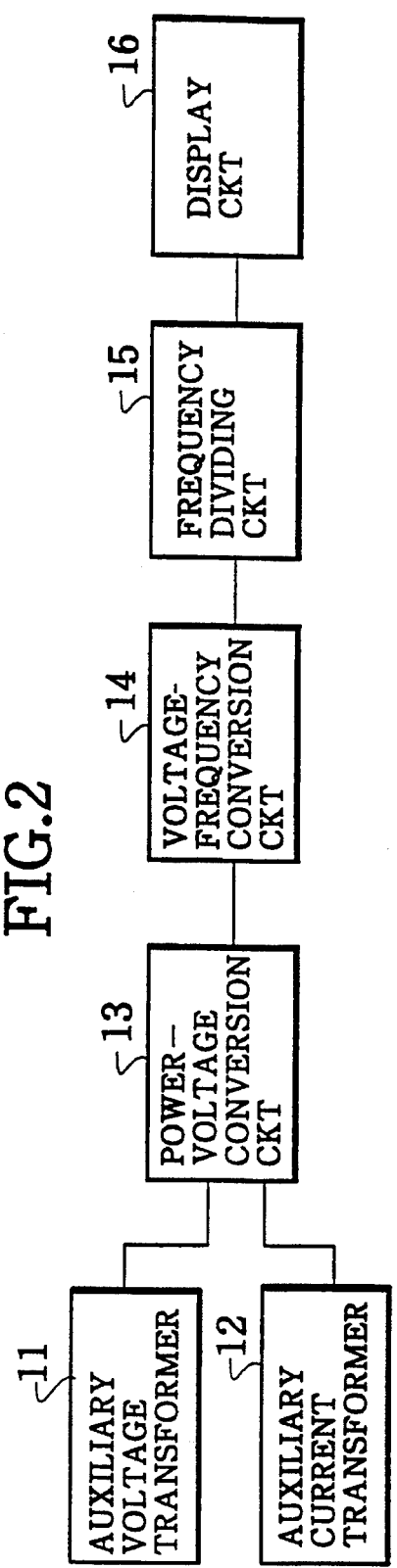
FIG. 2 is a block diagram of an electronic watthour meter according to a first embodiment of this invention.

Referring to FIG. 2, an electronic watthour meter comprises an auxiliary voltage transformer 11 for producing a voltage output signal proportional to a load voltage of a distribution line, an auxiliary current transformer 12 for producing a current output signal proportional to a consumed current, a power-voltage conversion circuit 13 for multiplying the voltage output signal and the current output signal from the auxiliary voltage transformer 11 and the auxiliary current transformer 12 to produce a voltage proportional to a load power, a voltage-frequency conversion circuit 14 supplied from The power-voltage conversion circuit 13 with the output voltage proportional to the load power for integrating the output voltage to produce a pulse signal, a frequency dividing circuit 15 for weighting the pulse signal from the voltage-frequency conversion circuit 14 to produce a divided pulse signal proportional to electric power, and a display circuit 16 responsive to the divided pulse signal from the frequency dividing circuit 15 for displaying the amount of the electric power consumption represented by the divided pulse signal.

Figure 3:
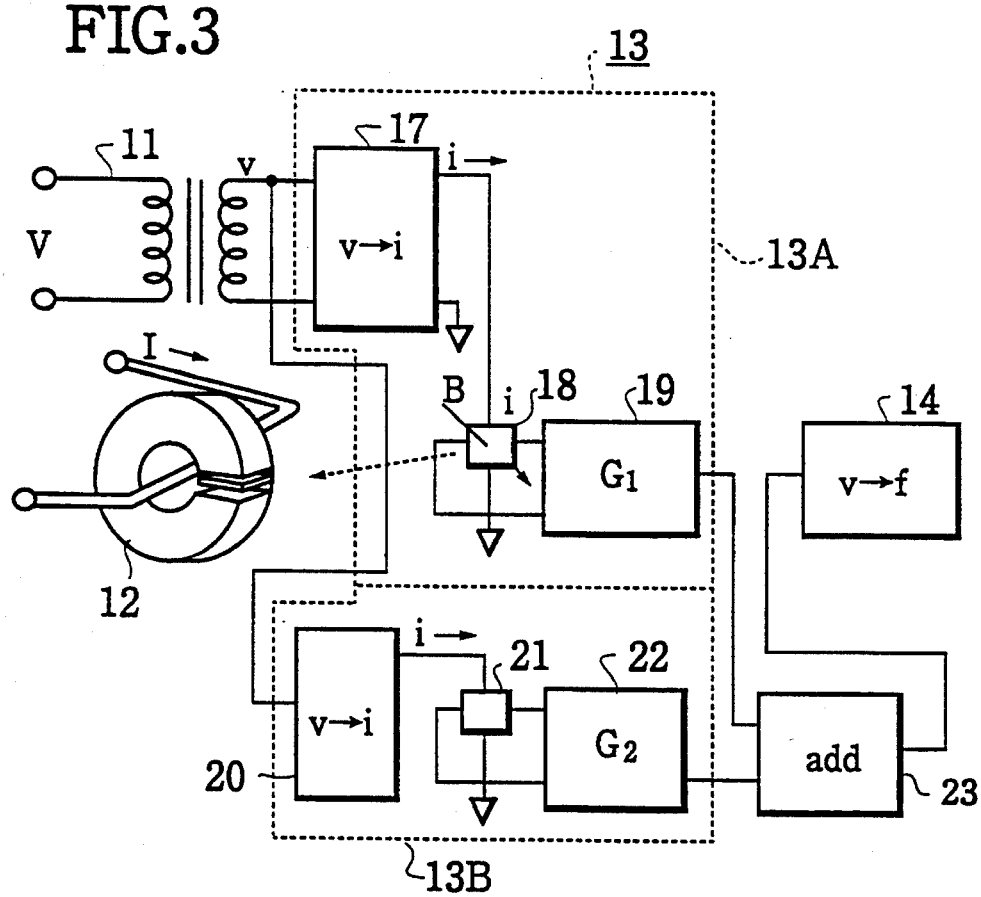
FIG. 3 shows a structure of a power-voltage conversion circuit for use in the electronic watthour meter illustrated in FIG. 2.

As shown in FIG. 3, the power-voltage conversion circuit 13 comprises first and second power-voltage converting sections 13A and 13B arranged in parallel.

The first power-voltage converting section 13A has a conversion element for conversion into electric energy by the use of a physical effect. In this embodiment, a first Hall-effect element 18, such as a Hall element, is used as the conversion element. Specifically, the power-voltage converting section 18A comprises a voltage-current conversion circuit 17 for converting an output voltage of the auxiliary voltage transformer 11 into an output current, the first magneto-electric conversion element 18 supplied with the output current of the voltage-current conversion circuit 17 and applied with a magnetic field produced by the auxiliary current transformer 12 for producing a voltage output proportional to electric power equivalent to a product of the current and a magnetic field intensity, and an amplifier circuit 19 supplied with the voltage output from the first magneto-electric conversion element 18 for amplifying the voltage output to an appropriate level.

The second power-voltage converting section comprises a voltage-current conversion circuit 20 for converting the output voltage of the auxiliary voltage transformer 11 into an output current, a second magneto-electric conversion element 21 supplied with the output current of the voltage-current conversion circuit 20, and an amplifier circuit 22. The second magneto-electric conversion element 21 has the same characteristics as that of the first magneto-electric conversion element 18.

The second magneto-electric conversion element 21 is supplied with no magnetic field, and the second magneto-electric conversion element 21 produces an offset voltage alone.

The first and the second power-voltage converting sections 13A and 13B are connected to a combining circuit 23.

Referring to FIG. 3, a circuit operation will be described. In FIG. 3, an input voltage is represented by V while a consumed current is represented by I. The auxiliary voltage transformer 11 produces an output voltage depicted by v. Each of the voltage-current conversion circuits 17 and 20 produces an output current i which is proportional to the output voltage v. The consumed current I is converted by a magnetic field detection core of the auxiliary current transformer 12 into a magnetic field intensity B.

The first magneto-electric conversion element 18 such as a Hall element is responsive to the current i and the magnetic field B and produces, in a theoretical sense, a first output voltage $V_{H1}$ calculated by the following formula:

$$V_{H1} = kiB,$$

where k represents a proportional constant.

Practically, the first magneto-electric conversion element 18 produces a first offset voltage depicted by $\alpha$. Accordingly, the first output voltage VH1 contains the first offset voltage as described in the preamble of the specification and therefore has a.c. and d.c. components. As a result, the first output voltage $V_{H1}$ is represented by:

$$V_{H1} = kiB + \alpha.$$

On the other hand, the second magneto-electric conversion element 21 of the second power-voltage converting section 13B produces a second offset voltage $\beta$ alone because the magnetic field produced by the auxiliary current transformer 12 is not supplied. As a result, a second output voltage $V_{H2}$ of the second magneto-electric conversion element 21 is represented by:

$$V_{H2} = \beta.$$

Summarizing, the first magneto-electric conversion element 18 produces the first output voltage represented by $V_{H1} = kiB + \alpha$ a while the second magneto-electric conversion element 21 produces the second output voltage represented by $V_{H2} = \beta$.

It is assumed here that the amplifier circuits 19 and 22 have gains $G_1$ and $G_2$, respectively. The combining circuit 23 calculates a sum $V_H$ of the first and the second output voltages $V_{1H}$ and $V_{H2}$ as follows:

$$\begin{aligned} V_H &= G_1 \times V_{H1} + G_2 \times V_{H2} \\ &= G_1 \times kiB + G_1 \times \alpha + G_2 \times \beta. \end{aligned}$$

The gain $G_1$ of the amplifier circuit 22 of the second power-voltage converting section 13B is selected to satisfy the following formula:

$$G_2 = -G_1 \times (\alpha/\beta).$$

In this event, the sum $V_{H'}$ is given by:

$$V_{H'} = G_1 \times kiB.$$

Thus, the first offset voltage $\alpha$ is compensated.

Second Embodiment

The electronic watthour meter according to the second embodiment of this invention has a structure similar to that of the first embodiment illustrated in FIG. 2. Accordingly, the similar parts will not be described any longer for the purpose of simplification.

Figure 4:
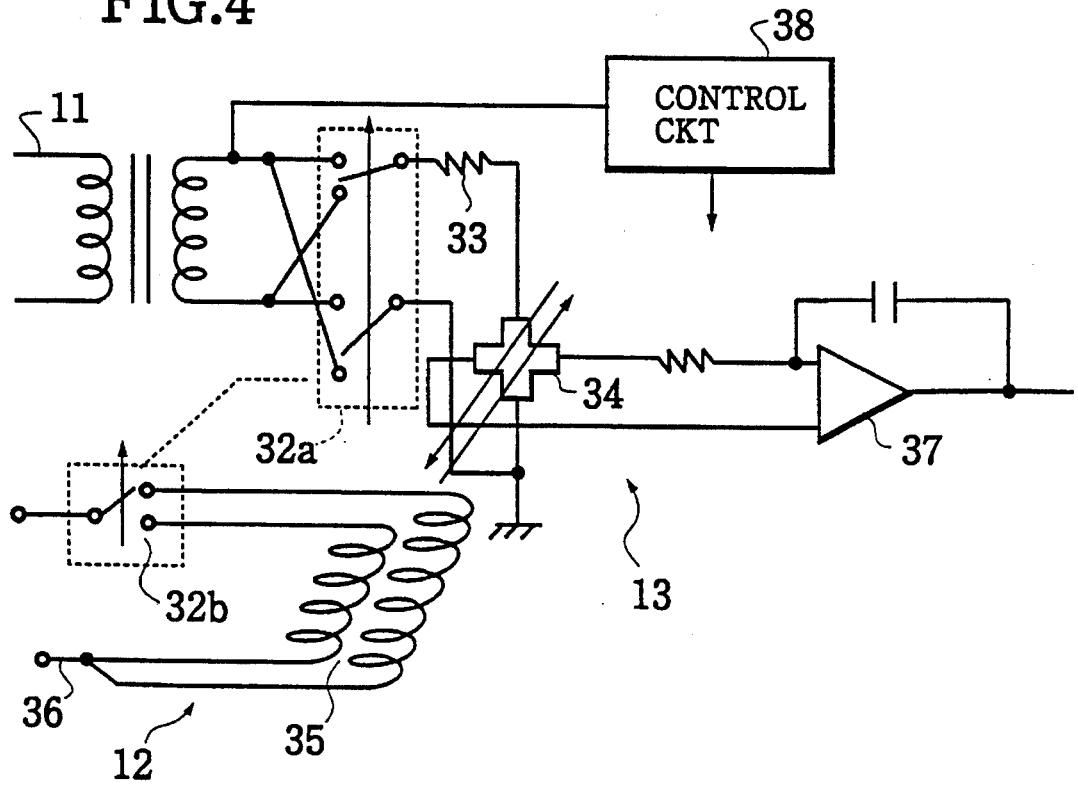
FIG. 4 shows a structure of a power-voltage conversion circuit for use in an electronic watthour meter according to a second embodiment of this invention.

Referring to FIG. 4, the auxiliary voltage transformer 11 produces an output signal proportional to a load voltage. The output signal is delivered through a switch 32a and a resistor 33 to be converted into a current which is supplied to a Hall element 34. On the other hand, a consumed current flowing through a load is supplied through a switch 32b cooperating with the switch 32a to a primary conductor 36 (shown in FIG. 5 in detail) wound around a core 35. The consumed current is converted by the core 35 into a magnetic field which is applied to the Hall element 34. A combination of the switches 32a and 32b serves as a switching unit.

Figure 5:
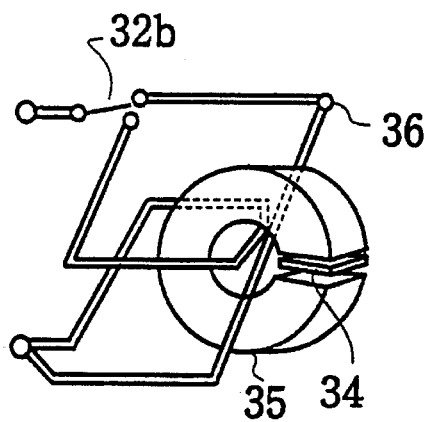
FIG. 5 is a view illustrating an arrangement of a core, a Hall element, and a primary conductor contained in the power-voltage conversion circuit illustrated in FIG. 4.

FIG. 5 shows an arrangement of the core 35, the Hall-effect element 34, and the primary conductor 36 in detail. As illustrated in the figure, the Hall element 34 is arranged within a gap defined by the core 35. The primary conductor 36 is wound around the core 35 to provide a single turn and a reverse single turn which are selectively activated by the switch 32b one at a time. In other words, the primary conductor 36 effectively passes through the core 35 only once. The switch 32b is for selectively switching a winding direction of the primary conductor 36 with respect to the core 35, namely, a direction of the current flowing through the primary conductor 36.

Turning back to FIG. 4, the switch 32a is connected to an output terminal of the auxiliary voltage transformer 11 so as to reverse the direction of the current flowing from the auxiliary voltage transformer 11 to the Hall element 34. Accordingly, by on-off control of the switches 32a and 32b, it is readily possible to change the direction of the current i supplied from the auxiliary voltage transformer 11 through the switch 32a to the Hall element 34 and the direction of the magnetic field B applied from the primary conductor 36 through the switch 32b to the Hall element 34.

As described above, the current i is supplied from the auxiliary voltage transformer 11 through the switch 32a to the Hall element 34 while the magnetic field B is supplied from the primary conductor 36 through the switch 32b to the Hall element 34. Consequently, the Hall element 34 produces an output voltage Vop represented by:

$$Vop = kiB,$$

where k represents a proportional constant.

As described before, the Hall element 34 produces an offset voltage Vou even in absence of the magnetic field. This results from irregularity in shape of the Hall-effect element 34, thermal electromotive force of the Hall-effect element 34 itself, or the like. Accordingly, the Hall-effect element 34 produces a total output voltage Vout represented by:

$$Vout = Vop + Vou.$$

The total output voltage Vout is varied in dependence upon the direction of the current i and the magnetic field B as shown in Table 1.

TABLE 1

| i | B | output |
|---|---|---|
| positive | positive | Vop + Vou |
| negative | positive | −Vop − Vou |
| positive | negative | −Vop + Vou |
| negative | negative | Vop − Vou |

As will be understood from Table 1, the offset voltage Vou is removed as follows. The switches 32a and 32b are controlled so that the directions of both the current i and the magnetic field B are positive during a particular cycle and negative during a next following cycle. The total output voltage produced by the Hall element 34 during these two cycles is integrated. Thus, the offset voltage Vou is removed as follows:

$$Vout = (Vop + Vou) + (Vop - Vou)$$
$$= 2Vop.$$

Accordingly, when the switches 32a and 32b are controlled as described above and the output voltage of the Hall element 34 is integrated by an integrator circuit 37 as shown in FIG. 4, the offset voltage Vou is removed to improve the efficiency of the electronic watthour meter. In FIG. 4, a reference numeral 38 represents a control circuit for controlling the switches 32a and 32b.

Figure 6:
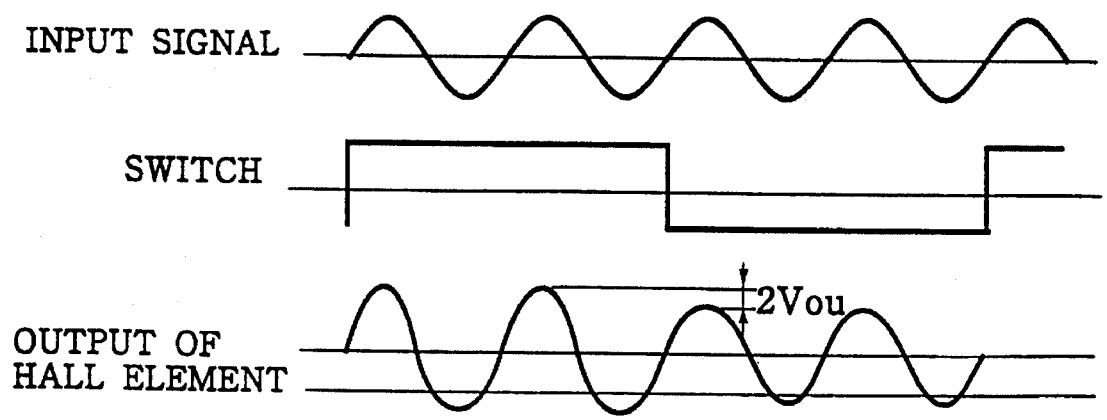
FIG. 6 is a view for describing an operation of the electronic watthour meter according to the second embodiment of this invention.

Referring to FIG. 6, an input signal is depicted in a first or an uppermost row. The input signal is representative of the current supplied through the auxiliary voltage transformer 11 and the magnetic field supplied through the primary conductor 36. The switches 32a and 32b are switched in every two cycles of the input signal as depicted in a second row in the figure. Every time when the switches 32a and 32b are switched, the difference 2Vou between +Vou and −Vou is produced in the output voltage of the Hall element 34, as shown in a third or a lowermost row in the figure. The offset voltage is compensated by integrating the output voltage in the successive two cycles before and after switching of the switches 32a, 32b.

In the first and the second embodiments, description has been made about the case where the Hall element is used as the magneto-electric conversion element. However, a magnetic reluctance element or a superconductor conversion element may be used as the magneto-electric conversion element.

What is claimed is:

1. An electronic watthour meter comprising:
   a magneto-electric conversion element supplied with a current proportional to a load voltage and applied with a magnetic field proportional to a load current for producing a voltage proportional to a load power given by said load voltage and said load current;
   switching means for periodically reversing in a predetermined cycle a direction of said current proportional to said load voltage and supplied to said magneto-electric conversion element and a direction of said magnetic field proportional to said load current and applied to said magneto-electric conversion element; and
   integrating means for integrating the output voltage of said magneto-electric conversion element.

2. An electronic watthour meter comprising:
   an auxiliary voltage transformer for producing a voltage output signal proportional to a load voltage of a distribution line;
   an auxiliary current transformer for producing a current output signal proportional to a consumed current;
   a power-voltage conversion circuit for multiplying said voltage and said current output signals of said auxiliary voltage transformer and said auxiliary current transformer to produce a voltage proportional to a load power; and
   a voltage-frequency conversion circuit supplied from said power-voltage conversion circuit with said output voltage proportional to said load power for integrating said output voltage to produce a pulse signal;
   wherein said power-voltage conversion circuit including:
   a magneto-electric conversion element supplied with the current proportional to said load voltage and applied with a magnetic field proportional to said load current for producing a voltage proportional to a load power given by said load voltage and said load current;

switching means for periodically reversing in a predetermined cycle a direction of said current proportional to said load voltage and supplied to said magneto-electric conversion element and a direction of said magnetic field proportional to said load current and applied to said magneto-electric conversion element; and integrating means for integrating the output voltage of said magneto-electric conversion element.

3. An electronic watthour meter comprising:

an auxiliary voltage transformer for producing a voltage output signal proportional to a load voltage of a distribution line;

an auxiliary current transformer for producing a current output signal proportional to a consumed current;

a power-voltage conversion circuit for multiplying said voltage and said current output signals of said auxiliary voltage transformer and said auxiliary current transformer to produce a voltage proportional to a load power;

a voltage-frequency conversion circuit supplied from said power-voltage conversion circuit with said output voltage proportional to said load power for integrating said output voltage to produce a pulse signal;

a frequency dividing circuit for weighting said pulse signal from said voltage-frequency conversion circuit to produce a divided pulse signal proportional to said load power; and a display circuit responsive to said divided pulse signal from said frequency dividing circuit for displaying the amount of electric power consumption;

wherein said power-voltage conversion circuit including:

a magneto-electric conversion element supplied from said auxiliary voltage transformer with a current proportional to said load voltage and applied from said auxiliary current transformer with a magnetic field proportional to said load current for producing a voltage proportional to a load power given by said load voltage and said load current;

switching means for periodically reversing in a predetermined cycle a direction of said current proportional to said load voltage and supplied to said magneto-electric conversion element and a direction of said magnetic field proportional to said load current and applied to said magneto-electric conversion element; and integrating means for integrating the output voltage of said magneto-electric conversion element.

\* \* \* \* \*